(12) United States Patent
Wang et al.

(10) Patent No.: US 7,667,993 B2
(45) Date of Patent: Feb. 23, 2010

(54) DUAL-PORTED AND-TYPE MATCH-LINE CIRCUIT FOR CONTENT-ADDRESSABLE MEMORIES

(75) Inventors: Chao-Ching Wang, Chiayi (TW); Chieh-Jen Cheng, Chia-Yi (TW); Jinn-Shyan Wang, Chia-Yi (TW); Tien-Fu Chen, Chia-Yi (TW)

(73) Assignee: National Chung Cheng University (TW)

( * ) Notice: Subject to any disclaimer, the term of this patent is extended or adjusted under 35 U.S.C. 154(b) by 73 days.

(21) Appl. No.: 11/907,524

(22) Filed: Oct. 12, 2007

(65) Prior Publication Data

US 2009/0097294 A1    Apr. 16, 2009

(51) Int. Cl.
*G11C 15/00* (2006.01)
(52) U.S. Cl. .................. 365/49.17; 365/49.1; 365/49.11

(58) Field of Classification Search ................ 365/49.1, 365/49.11, 49.17
See application file for complete search history.

(56) References Cited

U.S. PATENT DOCUMENTS

| | | | |
|---|---|---|---|
| 6,901,000 B1 * | 5/2005 | Ichiriu et al. ............. | 365/49.17 |
| 7,317,628 B1 * | 1/2008 | Meng ....................... | 365/49.17 |

* cited by examiner

*Primary Examiner*—Hoai V Ho
(74) *Attorney, Agent, or Firm*—Jackson IPG PLLC

(57) ABSTRACT

A dual-ported AND-type match-line circuit includes at least one dual-ported dynamic AND gate. The dual-ported dynamic AND gate includes a group of CAM cells and a dual-ported dynamic circuit. A group of CAM cells connected to a dual-ported dynamic circuit and to the GND. The dual-ported dynamic circuit is connected to a group of CAM cells. The dual-ported dynamic circuit includes a setting circuit, a first directing circuit, a second directing circuit, a first AND dynamic output circuit and a second AND dynamic output circuit.

16 Claims, 11 Drawing Sheets

DUAL-PORTED AND-TYPE MATCH-LINE CIRCUIT FOR CONTENT-ADDRESSABLE MEMORIES

FIELD OF THE INVENTION

The present invention relates to a dual-ported AND-type match-line circuit using in content-addressable memory ("CAM") and, more particularly, to a dual-ported AND-type match-line circuit using in CAM that can store two look-up tables in single memory array and search two stored look-up tables in each match operation. This invention not only improves the area utilization of the CAM but also enhances the search speed and reduces the power consumption.

DESCRIPTION OF THE RELATED ARTS

The CAM is an important element for a high-speed search engine. The CAM can store data such as S RAM and match input data with stored data. Therefore, the cells of a CAM contain the additional transistors for match operation expect for the transistors for storing data.

The match-line circuit collects the matching results which are generated by CAM cells. The design of the match-line circuit has a major impact on search speed and power consumption. The match-line circuits of CAM include NOR-type match-line circuits and NAND-type match-line circuits. It is generally recognized that NOR-type match-line circuits achieve high search speed but at the expense of high power consumption, while NAND-type match-line circuits are power efficient with the penalty of low speed. A NOR-type match-line circuit is often used in a search engine due to high search speed.

Recently, an AND-type match-line circuit constructed with the pseudo-footless clock-and-data pre-charged dynamic ("PF-CDPD") logic was proposed to achieve high speed and low power. Referring to FIG. 1, a match-line circuit 100 of a CAM includes a plurality of PF-CDPD AND gate circuits 101 each including a plurality of cells 102. The evaluation of each PF-CDPD AND gate circuit 101 in the match-line circuit 100 is triggered by the evaluated result of previous stage. If there is no data-matched for a PF-CDPD AND gate circuit 101, the following PF-CDPD AND gate circuits 101 will not be evaluated. Therefore, the match-line circuit 100 has characteristic of low power consumption, such as NAND-type match-line circuit. Since the input of the gate electrode G of the N-type metal oxide semiconductor ("NMOS") 103 in each cell 102 has been determined before the PF-CDPD AND gate circuit 101 enter evaluation phase. If the input of the gate electrode G of the NMOS 103 in each cell 102 of PF-CDPD and gate circuit 101 is "1" that is, all data stored in the cells of PF-CDPD AND gate circuit 101 is matched with the input data), the drain electrode D and source electrode S of the NMOS 103 will be discharge to 0 V, such as pseudo ground. The delay of each PF-CDPD match-line circuit 101 is almost the same as two inverters. The search speed of match-line circuit can be greatly increased, even higher than that of the NOR-type match-line circuits.

In the design of CAM, the area utilization is also an important design consideration because a CAM cell includes much more transistors than a general random access memory ("RAM") Because of large area of CAM, the design of search engine can not arbitrarily adopt CAM due to large cost. Therefore, area is often a concern in the design of a CAM. There are attempts to include dynamic cells in a CAM; however, it requires a special process so that they cannot widely be used and can not easily be integrated.

The present invention is therefore intended to obviate or at least alleviate the problems encountered in prior art.

SUMMARY OF THE INVENTION

The primary objective of the present invention is to increase the area utilization and reduce the power consumption of a CAM.

According to the present invention, a dual-ported AND-type match-line circuit includes at least one dual-ported dynamic AND gate. The dual-ported dynamic AND gate includes a group of CAM cells and a dual-ported dynamic circuit. A group of CAM cells connected to a dual-ported dynamic circuit and to the GND. The dual-ported dynamic circuit is connected to a group of CAM cells. The dual-ported dynamic circuit includes a setting circuit, a first directing circuit, a second directing circuit, a first AND dynamic output circuit and a second AND dynamic output circuit.

Other objectives, advantages and features of the present invention will become apparent from the following description referring to the attached drawings.

BRIEF DESCRIPTION OF THE DRAWINGS

The present invention will be described via the detailed illustration of two embodiments in view of prior art referring to the drawings.

DETAILED DESCRIPTION OF EMBODIMENT

Referring to FIGS. 2 through 11, there is shown a dual-ported AND-type match-line circuit for improving the area utilization and reducing the power consumption according to the present invention.

A cell of ternary content-addressable memory ("TCAM") can store "0" "1" and "don't care." Therefore the area of a TCAM is much larger than that of a binary CAM ("BiCAM"). According to the present invention, a dual-ported AND-type match-line circuit is devised to increase the area utilization by reduced the space stored "don't care". Moreover, the power consumption is reduced.

Figure 1:
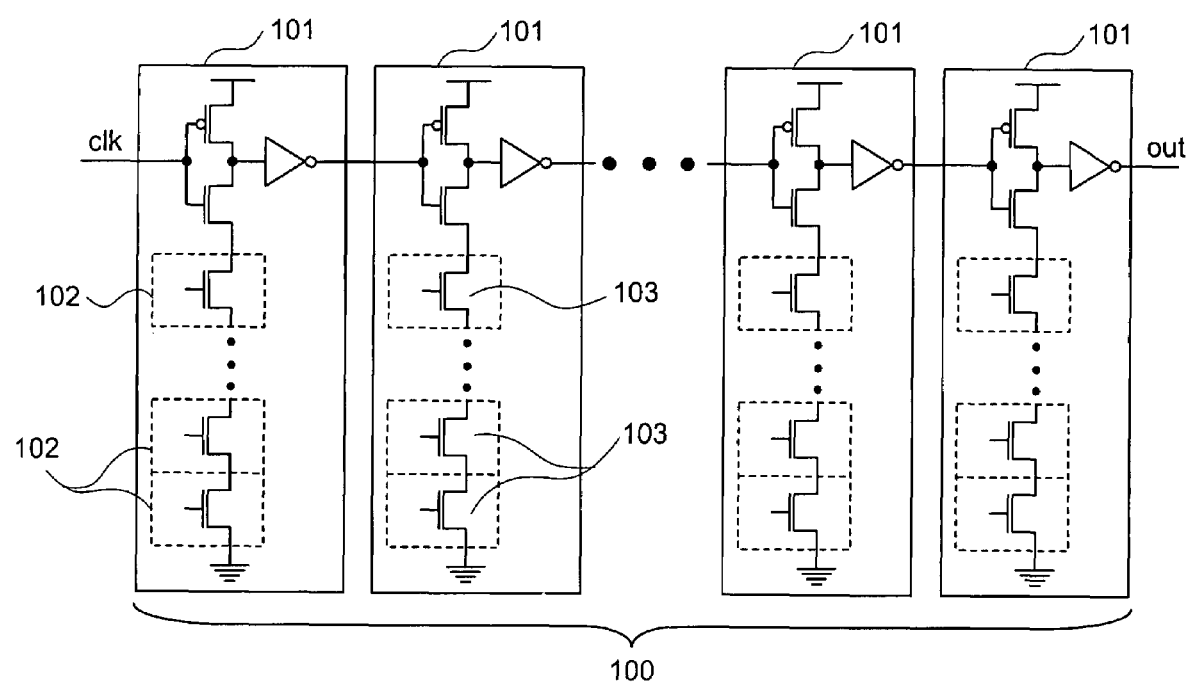
FIG. 1 is a block diagram of a conventional PF-CDPD AND gate circuit.
Figure 2:
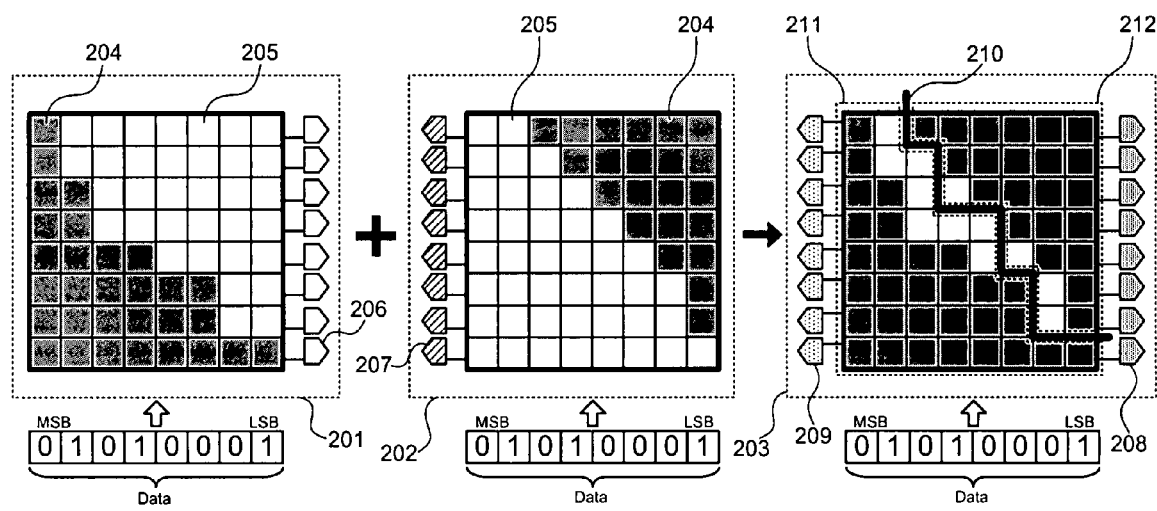
FIG. 2 is a chart for showing the concept of the present invention.

Referring to FIG. 2, there are shown a single-ported CAM 201 and another single-ported CAM 202. In each CAM, data are sorted according to the prefix lengths. Therefore, each CAM is divided into two regions; one ("matching region") for storing binary data and the other ("none-matching region") for storing "don't care". The matching operation will ignore the cells for storing "don't care". Therefore, then one-matching region is useless for the TCAM but occupies large area and consumes much energy. The concept of the present invention is to devise a dual-ported AND-type match-line circuit to store the matching region of the CAM 202 into the none-matching region of the CAM 201.

According to the present invention, a TCAM 203 is used to store the data in matching region of the CAMs 201 and 202. For the clarity of the description, a phantom boundary 210 is shown in FIG. 2 to separate a region 211 from another region 212. The region 211 is assigned to store the data in matching region of the CAM 201. The region 212 is assigned to store the data in matching region of the CAM 202. The prevent invention reduces the number of cells 205 for storing "don't care". The use of one memory array to store the data in matching region of two memories improves the area utilization and reduces the power consumption.

The dual-ported AND-type match-line circuit includes two matching output ports 208 and 209 according to the present invention. The matching result of region 211 will be propagated to matching output port 208. The matching result of region 212 will be propagated to matching output port 209. In this design, the matching result of region 211 does not interfere with the matching result of region 212. The matching result of each region will be propagated to corresponding output port according to assignment of region.

Figure 3:
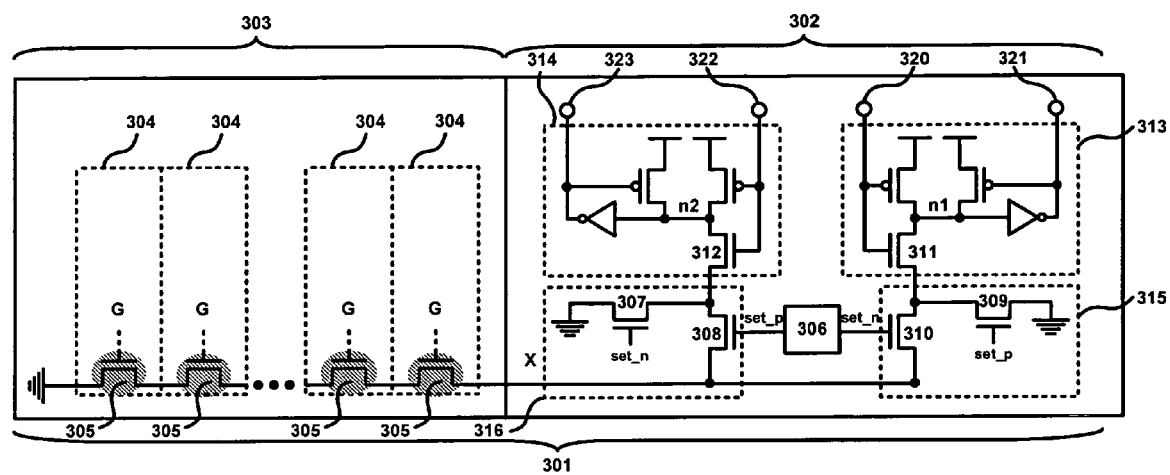
FIG. 3 is a block diagram of a dual-ported dynamic AND gate according to the present invention.

Referring to FIG. 3, a dual-ported dynamic AND gate 301 includes a dual-ported dynamic circuit 302 and a group 303 of cells 304. The number of the cells 304 could be decided by designer. The result of matching the data stored in the cells 304 with external data is reflected at the gate electrode G of a transistor 305. If the stored data matched with the external data, the gate electrode G will be charged to a high voltage level, and the transistor will be turned on. Otherwise, the gate electrode G will be discharged to a 0 V, and the transistor 305 will be turned off. If whole data stored in the cells 304 of the group 303 and external data are matched, a node X will be discharged to 0 V by the turn-on transistors 305. Otherwise, the node X will be retained at a high voltage level. From the voltage of the node X, it can be learned whether there is a match for each cell 304 of the group 303 or not.

The dual-ported dynamic circuit 302 transmits the matching result X of the group 303 to a match line ML1 or ML2 depend on the control of a setting circuit 306. The setting circuit 306 can store data and determine whether the matching result of the dual-ported dynamic AND gate 301 belongs to the match line ML1 or ML2 in the initialization of the circuit. The setting circuit 306 includes two complementary outputs set_p and set_n. If the output set_p is at a high voltage level, the output set_n will be at a low voltage level, and vice versa. To assign the matching result of the dual-ported dynamic AND gate 301 to the match line ML1, the output set_p is set at the low voltage level. A transistor 308 of a second directing circuit 316 and a transistor 309 of a first directing circuit 315 are turned off. A transistor 307 of the second directing circuit 316 and a transistor 310 of the first directing circuit 315 are turned on. If the previous dual-ported dynamic AND gate of the match line ML1 has data-matched, an input 320 of a first dynamic output circuit 313 will be at a high voltage level. The matching result of the group 303 will be transmitted to a node n1 through the transistor 310 of the first directing circuit 315 and a transistor 311 of the first dynamic output circuit 313 and further to the output 321 of the first dynamic output circuit 313.

The concept of the present invention is to store the data of a first memory into then one-matching region of a second memory 2. The match line ML2 treats the stored data of group 303 belong to match line ML1 as "don't care". The match line ML2 will always output data-matched through the turn-on transistor 307 and the turn-off transistor 308 no matter what the matching result of the group 303. The matching result of the group 303 will not be transmitted to node n2. If the previous dual-ported dynamic AND gate of the match line ML2 has data-matched, an input 322 of a second dynamic output circuit 314 will be at a high voltage level and the node n2 will be discharged to a low voltage by the turn-on transistors 312 and 307. Therefore output 323 of second dynamic output circuit 314 will output high according to the low voltage of node n2.

Figure 4:
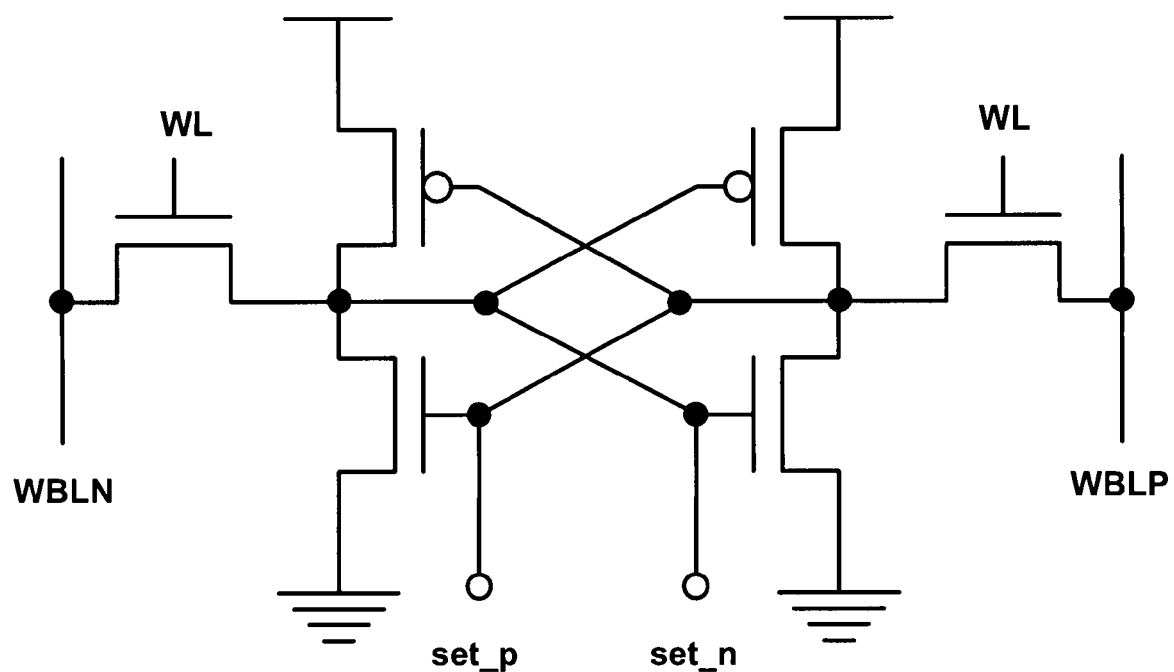
FIG. 4 is a schematic of a setting circuit according to the present invention.

The setting circuit 306 could be implemented by SRAM cell, flip-flop or other storage elements. Referring to FIG. 4, the setting circuit 306 includes the SRAM cells of six transistors according to a first embodiment of the present invention. A word line is designated "WL". Two write bit lines are designated "WBLP" and "WBLN", respectively. The design of the word lines and write bit line is identical to that of the S RAM and therefore will not be described in detail.

Figure 5:
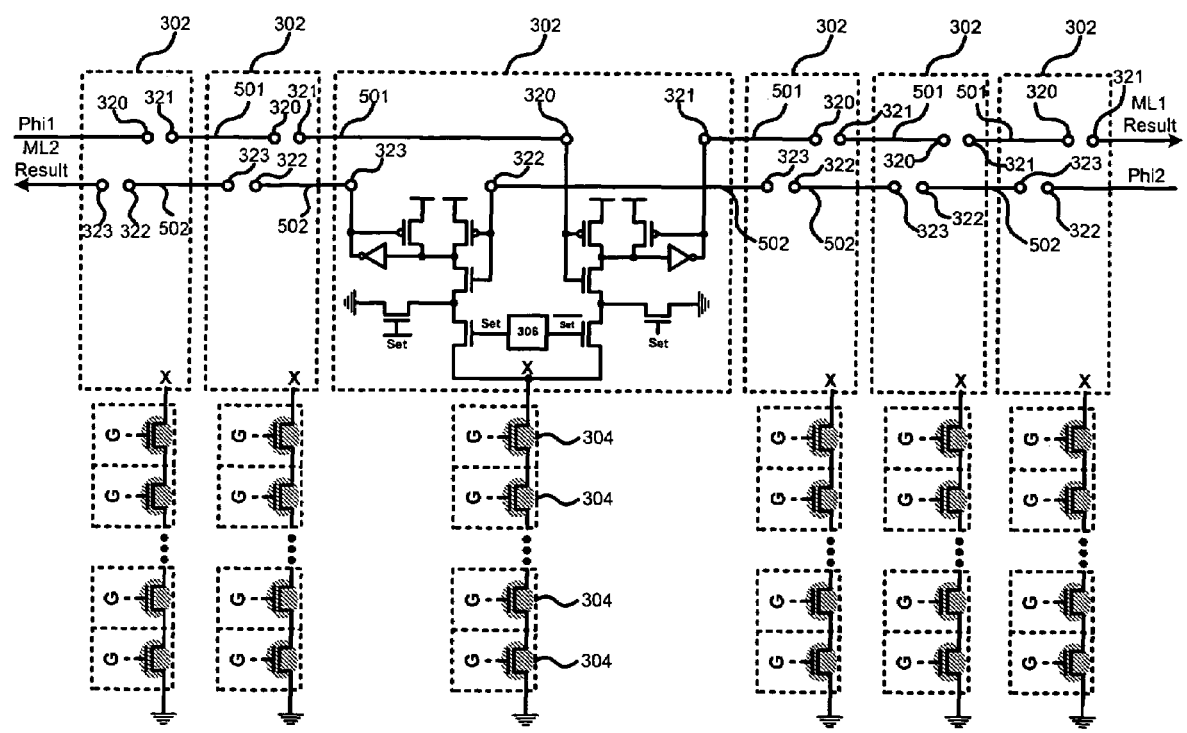
FIG. 5 is a block diagram of a dual-ported AND-type match-line circuit according to the first embodiment of the present invention.

Referring to FIG. 5, there is shown a dual-ported AND-type match-line circuit according to the first embodiment of the present invention. The match line ML1 is made by using a wire 501 to connect the output 321 of a current stage to the input 320 of a following stage. The match line ML2 is made by using a wire 502 to connect the output 323 of the current stage to the input 322 of the following stage.

Since the dual-ported AND-type match-line circuit is made of dual-ported dynamic AND gate, the dual-ported AND-type match-line circuit work as the general dynamic circuit that has pre-charge phase and evaluation phase. Each of the pre-charge and evaluation phases takes half a clock cycle. The first half clock cycle is the pre-charge phase wherein both of phi1 and phi2 are at a low voltage. Therefore, the outputs 321 and 323 and inputs 320 and 322 of each dual-ported dynamic AND gates are at a low voltage. In this phase, the external datum begins to compare with all the data previously written and stored into the cells 304, and the voltage at gate electrode G of each memory cell goes toward its final value. If the external datum matches with the stored data of all cells 304, the node X will be set at the low voltage.

The second half clock cycle is the evaluation phase wherein both of phi1 and phi2 are going to high from low voltage level. If the first stage has data-matched, the outputs 321 and 323 of the first stage will be set at the high voltage, and a high voltage signal will be transmitted to the inputs 320 and 322 of a second stage. If the second stage also has data-matched, the high voltage signal meant data-matched will be transmitted to the third stage, and so on. The match operation of the match line ML1 is started from the leftmost dual-ported dynamic AND gate and propagate the matching signal to the right. If all dual-ported dynamic AND gate of entire match line ML1 are data-matched, the output of match line "ML1 Result" will go to logic "1". Otherwise, the output of match line "ML1 Result" will keep logic "0". The match operation of the match line ML2 is started from the rightmost dual-ported dynamic AND gate and propagate the matching signal to the left. If all dual-ported dynamic AND gate of entire match line ML2 are data-matched, the output of match line "ML2 Result" will go to logic "1". Otherwise, the output of match line "ML2 Result" will keep logic "0". The matching signals of the match lines ML1 and ML2 do not interfere with each other as discussed above.

Figure 6:
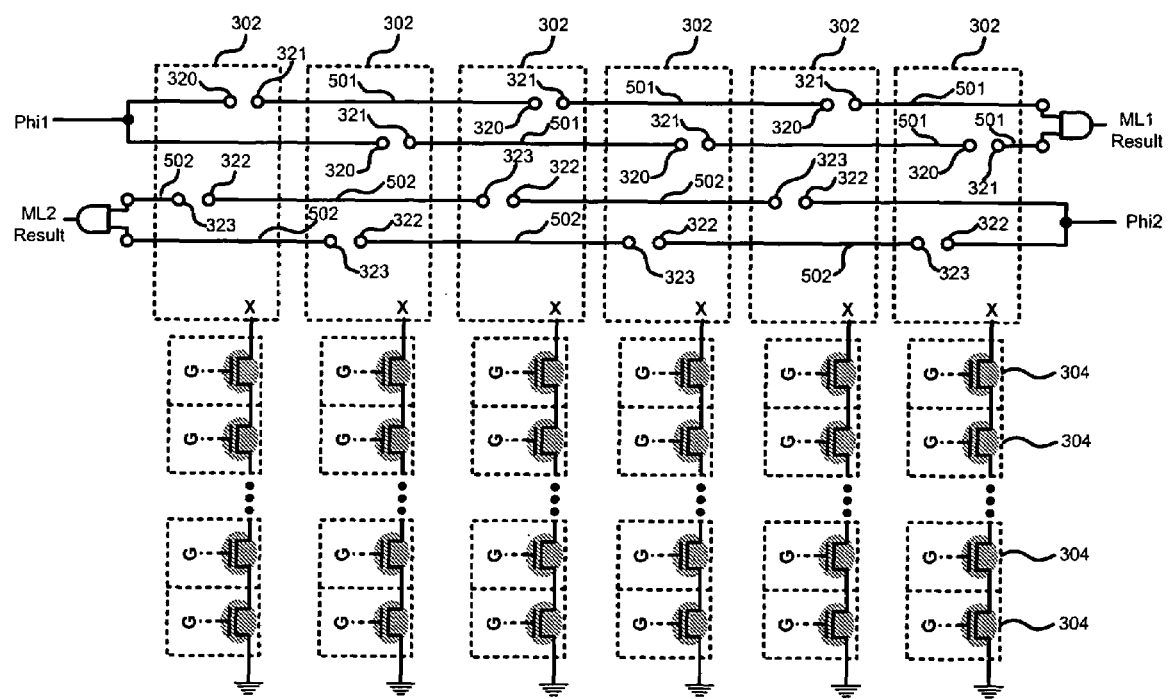
FIG. 6 is a block diagram of a dual-ported AND-type match-line circuit according to the second embodiment of the present invention.

Referring to FIG. 6, there is shown a dual-ported AND-type match-line circuit according to a second embodiment of the present invention. The match lines ML1 and ML2 are further branched for high search speed. The search speed of match line could be enhanced by more branches of match line according to the designer's discretion. There are two branches as shown in FIG. 6. The designer can however design a match line to include three branches or more. The operation principle of the dual-ported AND-type match-line circuit does not change with the number of the branches. The operation of the second embodiment is like that of the first embodiment and therefore will not be described in detail.

Figure 7:
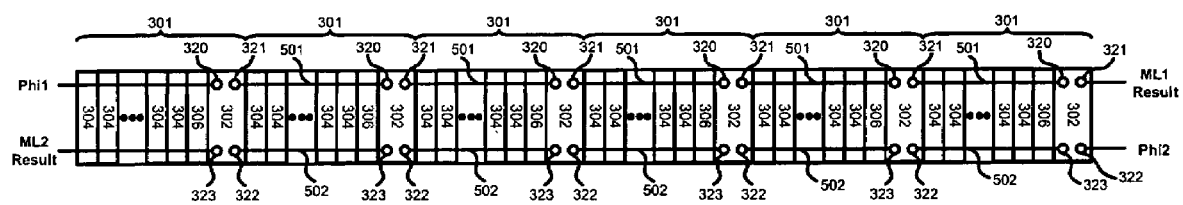
FIG. 7 is a layout of the dual-ported AND-type match-line circuit shown in FIG. 5.

Referring to FIG. 7, the layouts of all components in whole match-line circuit are designed as the same layout height and the layout of entire match-line circuit can be stack arrangement. The design of the layout of the circuit will be very easy.

Figure 8:
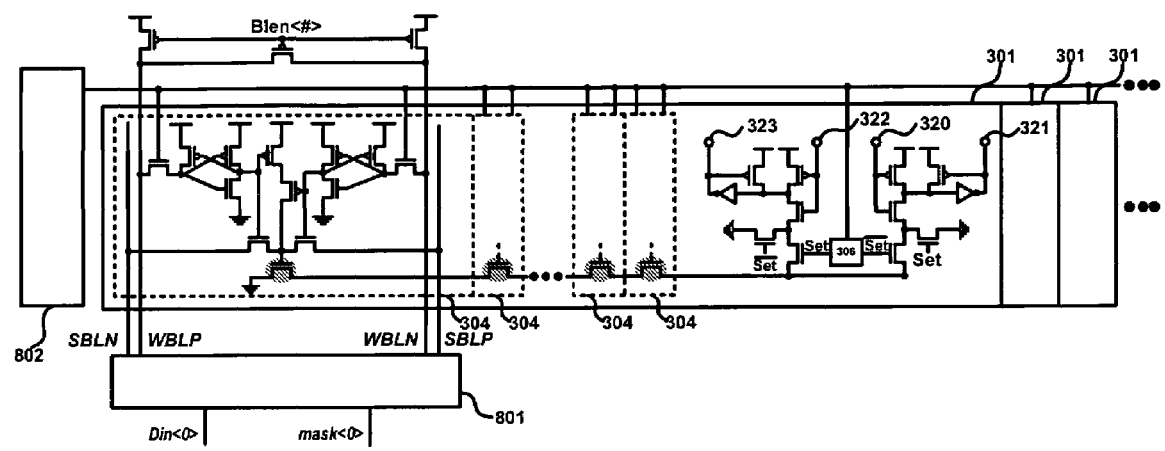
FIG. 8 is a block diagram of a CAM including the match-line circuit shown in FIG. 5.

Referring to FIG. 8, the signal of word line is generated by an address decoder 802. The external datum is fed into cells 304 through searching and writing buffer 801 when the CAM performs writing and searching operation.

Figure 9:
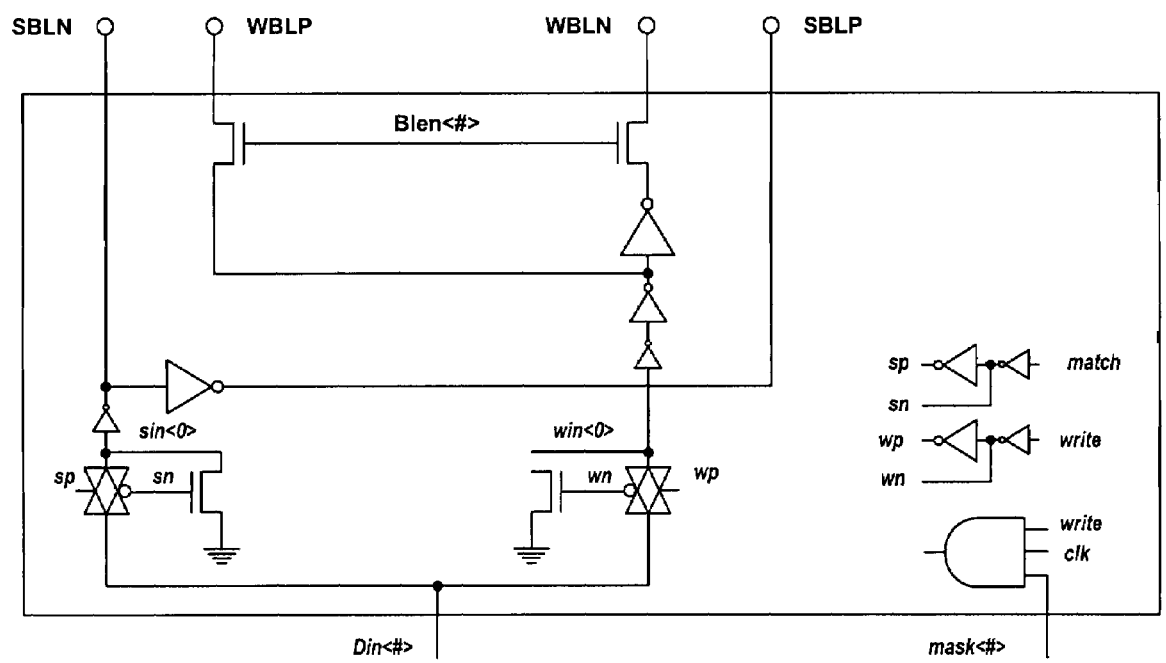
FIG. 9 is a schematic for showing the searching of and writing into a buffer according to the present invention.
Figure 10:
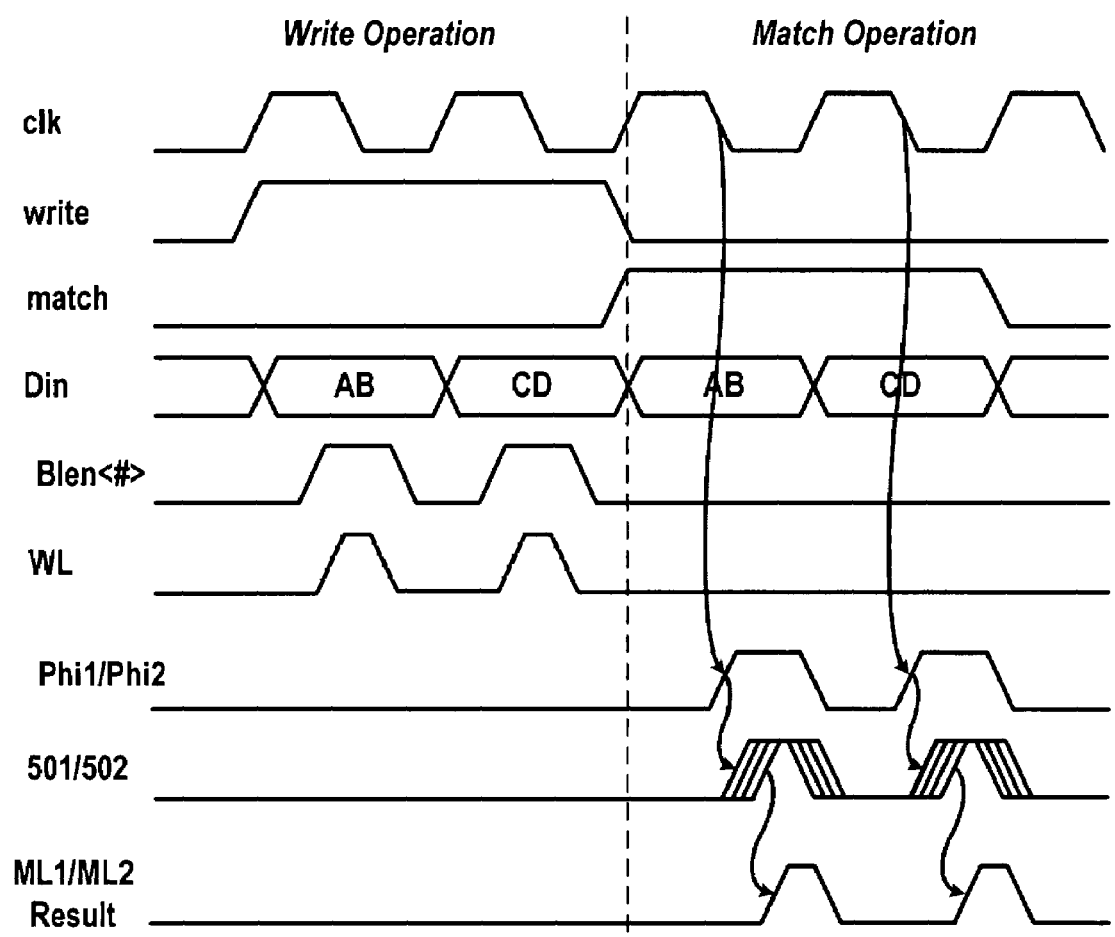
FIG. 10 is a waveform of the CAM shown in FIG. 8.

Referring to FIGS. 9 and 10, when the CAM performs the writing operation, the "write" signal will be set to high voltage. Now, the external datum is fed to the WBLP/WBLN by the searching and writing buffer 801. At the same time, the address decoder 802 decodes the address and set the corresponding word line as high voltage. Therefore, the datum can be written into the cells 304 of corresponding row. When the CAM performs the matching operation, the "match" signal will be set to high voltage. In the positive half clock cycle of matching operation, the matching circuit enters pre-charge phase. In this phase, the external datum is fed into a SBLP/SBLN and matched with the stored data in all cells 304 of memory array. In the negative half clock cycle of matching operation, the matching circuit enters evaluation phase. In this phase, the triggered signals phi1 and phi2 of the matching circuit will go to high voltage. If the stored datum of entire row is matched with the external datum, the output of the match line will be the logic "1".

Although the embodiments are designed based on the properties of ternary CAM cells, the present invention can be embodied in binary CAM cells so that the area of the memory can further be reduced.

Figure 11:
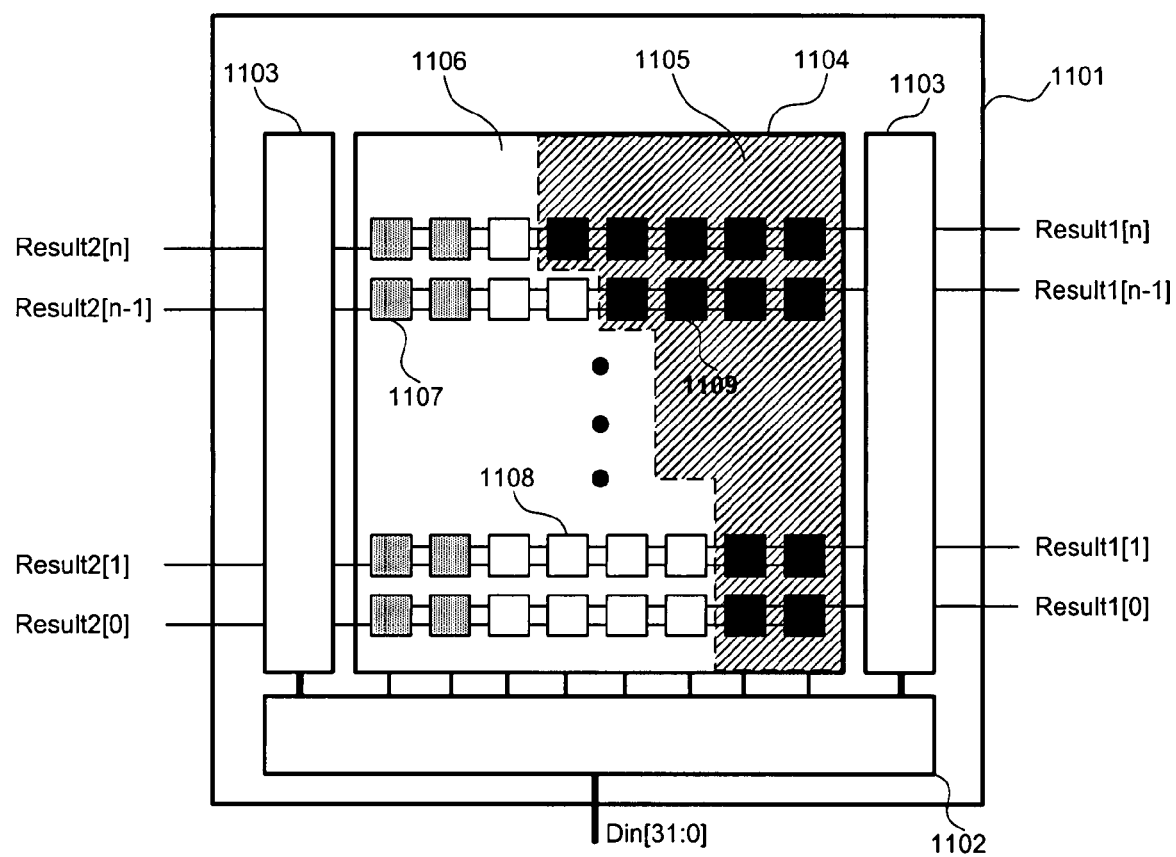
FIG. 11 is a block diagram of the CAM shown in FIG. 8.

Referring to FIG. 11, a CAM 1101 includes a bit width of 32 bits. It is composed of eight dual-ported dynamic AND gates 1107, 1108 and 1109 with four cells. The setting circuit 306 divides a memory array 1104 into region 1105 and 1106. The design of the regions 1105 and 1106 are like that of the regions 211 and 212 shown in FIG. 2. In the region 1105, the cells of the first eight bits do not store the "don't care" according to analysis. Therefore, the cells of the first eight bits can be replace by the dual-ported dynamic AND gates with four binary cells. The other cells are still composed of ternary cells to increase the storing flexibility. We name such a new design as BiTCAM, since it combines binary and ternary cells. The embodiment further includes a searching and writing buffer 1102 and an address decoder 1103.

As discussed above, the dual-ported dynamic AND gate according to the present invention exhibits the following advantages:

Firstly, based on the design of the match-line circuit with the dual-ported dynamic AND gate, the content-addressable memory can store two lookup tables in one memory array. Therefore, the area utilization could be greatly improved and the problems with the large area of the TCAM could be overcome.

Secondly, the dual-ported AND-type match-line circuit could generate two matching result in each matching operation. The searching energy of each datum is much lower than single-ported match-line circuit. Besides, the dual-ported AND-type match-line circuit adopts AND-type match-line circuit with the characteristic of low power consumption. According to the two reasons, the dual-ported AND-type match-line circuit achieves low power consumption and high throughput rate.

Thirdly, the memory can store two lookup tables. The setting of the boundaries of the lookup table is flexible and at the designer's discretion.

Fourthly, the BiTCAM make the binary cell and ternary cell can be used together for an optimized design, thus further reducing the area and the power consumption.

Fifthly the stack arrangement of layout renders the design of the dual-ported AND-type match-line circuit very easy.

The present invention has been described via the detailed illustration of the embodiments. Those skilled in the art can derive variations from the embodiments without departing from the scope of the present invention. Therefore, the embodiments shall not limit the scope of the present invention defined in the claims.

The invention claimed is:

1. A dual-ported AND-type match-line circuit comprising at least one dual-ported dynamic AND gate comprising:
   a group of CAM cells connected to a dual-ported dynamic circuit and to the GND; and
   a dual-ported dynamic circuit connected to the group of CAM cells, wherein the dual-ported dynamic circuit comprises a setting circuit, a first directing circuit, a second directing circuit, a first dynamic output circuit and a second dynamic output circuit.

2. The dual-ported AND-type match-line circuit according to claim 1, wherein the CAM cells comprise binary CAM cells.

3. The dual-ported AND-type match-line circuit according to claim 1, where in the CAM cells comprise ternary CAM cells.

4. The dual-ported AND-type match-line circuit according to claim 1, wherein the CAM cells comprise binary and ternary CAM cells.

5. The dual-ported AND-type match-line circuit according to claim 1, wherein the setting circuit comprises a storage element.

6. The dual-ported AND-type match-line circuit according to claim 5, wherein the storage element is implement by a group consisting of a RAM, a flip-flop and a latch.

7. The dual-ported AND-type match-line circuit according to claim 1, wherein the setting circuit controls the directing circuits and transmits the matching result to a selected one of the dynamic output circuits and further to a selected one of two match lines.

8. The dual-ported AND-type match-line circuit according to claim 1, wherein each of the directing circuits comprises a directing element and a grounding element.

9. The dual-ported AND-type match-line circuit according to claim 8, wherein the directing and grounding elements are composed of transistors.

10. The dual-ported AND-type match-line circuit according to claim 8, wherein the directing elements transmit the matching result of the group of CAM cells to the dynamic output circuits.

11. The dual-ported AND-type match-line circuit according to claim 8, wherein the grounding element connects a related one of the dynamic output circuits to the GND.

12. The dual-ported AND-type match-line circuit according to claim 1, wherein each of the dynamic output circuits comprises an output pre-charge element and an evaluation element.

13. The dual-ported AND-type match-line circuit according to claim 1 comprising a plurality of dual-ported dynamic AND gates, wherein the first dynamic output circuit of each of the dual-ported dynamic AND gates comprises an output connected to an input of the first dynamic output circuit of a following dual-ported dynamic AND gate in serial, and the second dynamic output circuit of each of the dual-ported dynamic AND gates comprises an output connected to an input of the second dynamic output circuit of a following dual-ported dynamic AND gate in serial.

14. The dual-ported AND-type match-line circuit according to claim 13, wherein the dual-ported AND-type match-line circuit could be composed of several branches of dual-ported AND-type match-line circuit.

15. The dual-ported AND-type match-line circuit according to claim 1, wherein the CAM cells, the setting circuit and the AND-gate dynamic circuits adopt the stack arrangement of layout using the same layout height of each component.

16. The dual-ported AND-type match-line circuit according to claim 1, wherein the dual-ported AND gate forms a dual-ported CAM comprising a dual-ported AND-type match-line circuit, a searching and writing buffer and an address decoder.

* * * * *